United States Patent
Hedler et al.

(10) Patent No.: US 6,826,037 B2
(45) Date of Patent: Nov. 30, 2004

(54) ELECTRONIC STRUCTURE

(75) Inventors: Harry Hedler, Germering (DE); Thorsten Meyer, Dresden (DE); Barbara Vasquez, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/157,175

(22) Filed: May 29, 2002

(65) Prior Publication Data

US 2002/0181218 A1 Dec. 5, 2002

(30) Foreign Application Priority Data

May 31, 2001 (DE) .......................................... 101 26 568

(51) Int. Cl.[7] .............................................. H05K 5/00
(52) U.S. Cl. ....................... 361/679; 361/690; 361/719; 257/737; 174/259
(58) Field of Search ................................. 361/679–687, 361/688, 690, 715, 719–727; 257/707, 712, 737–738; 174/252, 259; 445/24

(56) References Cited

U.S. PATENT DOCUMENTS

| | | | |
|---|---|---|---|
| 5,261,158 A | | 11/1993 | Schreiber et al. ............. 29/848 |
| 5,477,087 A | | 12/1995 | Kawakita et al. ........... 257/737 |
| 5,592,736 A | * | 1/1997 | Akram et al. ................. 29/841 |
| 5,633,533 A | * | 5/1997 | Andros et al. .............. 257/707 |
| 5,783,465 A | | 7/1998 | Canning et al. ............ 438/119 |
| 6,225,695 B1 | * | 5/2001 | Chia et al. ................... 257/712 |
| 6,423,576 B1 | * | 7/2002 | Hoffman ..................... 438/118 |
| 6,477,052 B1 | * | 11/2002 | Barcley ...................... 361/719 |
| 2003/0162463 A1 | * | 8/2003 | Hayashi et al. ............... 445/24 |

FOREIGN PATENT DOCUMENTS

| | | | |
|---|---|---|---|
| DE | 10016132 | 10/2001 | .......... H01L/23/50 |
| JP | 05074857 | 3/1993 | .......... H01L/21/60 |

* cited by examiner

*Primary Examiner*—Hung Van Duong
(74) *Attorney, Agent, or Firm*—Fish & Richardson P.C.

(57) ABSTRACT

An electronic structure includes an electronic component, which is configured to be in electric contact with a base and has a mounting side configured for mounting onto the base. The structure also includes a raised elastic support positioned on the component and multiple contacts positioned on the component, with at least one contact also being positioned on the support.

25 Claims, 3 Drawing Sheets

ELECTRONIC STRUCTURE

RELATED APPLICATIONS

This application claims benefit of foreign priority from German Patent Application DE 101 26 568.9, filed May 31, 2001, and titled "Electronic Component," which is incorporated by reference.

TECHNICAL FIELD

The invention relates to forming contacts on an electronic component.

BACKGROUND

In particular, electronic components have a large number of contacts, such as CSPs (chip size packages) or BGAs (ball grid arrays) that create difficulties during mounting inasmuch as secure fixing and, at the same time, correct contact with each contact need to be achieved for corresponding contacts on the base, e.g., a printed circuit board (PC board). It is known practice to put solder balls onto the component's contacts, which solder balls are fused on in a temperature step for the purposes of mounting and making contact and thus produce the connection between the component and the base while making contact at the same time. This is disadvantageous in a number of respects, however. First, attaching the solder balls is complex and laborious, and also fixing requires an additional temperature step which is relatively long, since it is necessary to ensure that fusion of the solder ball is complete, and which can therefore have disadvantageous effects on the component and/or on the base. In addition, the solder joint results in a hard connection which provides hardly any protection against movement of the chip in the x/y direction to ensure that the connection is not broken under such strain. To get around this, use is made of a filling between the chip and the base in order to stabilize it to this extent.

SUMMARY

The invention is based on the problem of specifying a component which can be securely mounted and have contact made with it in a simple manner, even with a large number of contacts.

The invention solves this problem by providing an is electronic component for which the contacts are put on a raised elastic support.

The inventive component has a relief-like structure on its mounting side, caused by the one or the plurality of elastic, raised supports onto which the component's contacts, with which the mating contacts on the base need to make contact, are put in a protuberant position. The elastic support affords adequate x and y direction securing without the need for a filling underneath. The elastic packing at the contact point is sufficient for this. The protuberant arrangement ensures that contact can be made reliably and also affords protection in the z-direction against compression of the contact connection, on account of the elasticity. The elastic support advantageously absorbs any forces acting on the component and/or on the base and hence on the mechanical and electrical connection, so that this makes it possible to attain a high level of protection for the mechanical and electrical connection. In addition, a very high density of contacts can be produced.

In accordance with the invention, each contact can be put on a separate support; alternatively, a plurality of contacts can also be put on a common support. The contacts can be produced in a conventional manner, e.g., by sputtering a contact layer and subsequent plating etc. using contact materials such as copper, nickel or gold. All methods with which the person skilled in the art is familiar are conceivable for this.

A support holding a plurality of contacts is expediently of strip-shaped design. To separate or expose the contacts to a large degree, it is expedient if the support is eroded in the area of two adjacent contacts, which can be achieved most expediently by means of wet or dry etching on the supports.

To be able to raise the contacts in a particularly simple manner, it is expedient if the support has an outwardly curved surface. An outwardly curved surface is also advantageous to the extent that the contacts can be connected by means of a contact link to bonding pads on the element which are arranged next to the elastic support. The contact links, which run from the contact on the support along the top of the support to bonding pads on the mounting side, have no sharp edges in this respect, which are sometimes difficult to cover. The support itself should expediently be made of a dielectric, that is to say insulating, material, which is advantageous particularly when using a strip-shaped support holding a plurality of contacts, in order to insulate the individual contacts from one another. Expediently, the support used for this is made of silicone, a silicone-based material or another flexible material.

To be able to connect the component securely to the base, a coating which produces a firm connection to the base can be put onto each contact, with either a conductive adhesive layer or else a very thin solder layer being able to be used for said coating. In this case, the solder layer can be in a very thin form, which has the advantage that the temperature step required to start the solder layer melting can be very short and hence put little strain on the component/base.

Besides the electronic component itself, the invention also relates to a method for producing an electronic component, particularly a chip of the type described above, in which one or more raised elastic supports are put onto the mounting side of the component and then have the contacts put onto them.

The support is expediently printed onto the mounting side of the component. A suitable material is, by way of example, silicone, another silicone-based material or another flexible material.

In this context, a single support can be put on for each contact; alternatively, a plurality of contacts can also be put onto a common support. A support holding such a plurality of contacts is expediently put on in the form of a strip and, when the contacts have been put on, can be eroded in the area between two contacts, which can easily be achieved by means of selective etching.

In addition, a coating which produces a firm connection to the base can be put onto the contacts, e.g., using a conductive adhesive layer or a solder layer.

Further advantages, features and details of the invention can be found in the exemplary embodiments described below and with reference to the drawings, in which:

DESCRIPTION OF THE DRAWINGS

FIG. 2 is a diagram showing the component from FIG. 1 after the contacts have been put on.

DETAILED DESCRIPTION

Figure 1:
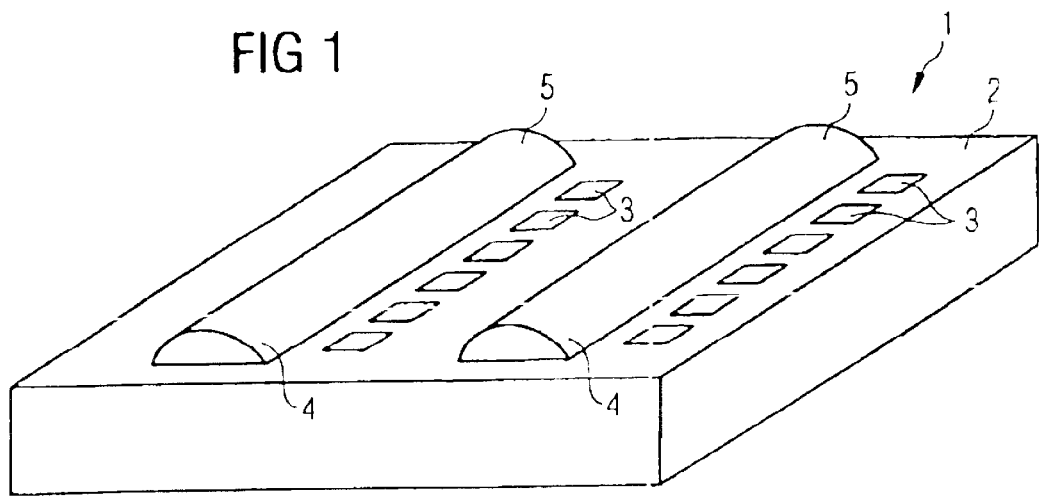
FIG. 1 is a diagram showing an inventive component having two strip-shaped supports put on the mounting side.

FIG. 1 shows a basic illustration of an inventive component 1, e.g., a chip in the form of a CSP or BGA component, whose mounting side 2, that is to say the side used to mount it and to make contact with it on a base (which is yet to be described), has a plurality of bonding pads 3 on it. In the exemplary embodiment shown, two strip-shaped supports 4 have been put onto the mounting side 2 next to the bonding pads 3. The supports 4 are elastic; they are preferably made of dielectric silicone, a silicone-based material or of another flexible material and are preferably printed onto the mounting side 2 using a printing method. As can be seen, their top 5 is convexly curved outward. The supports 4 are raised from the mounting side 2, that is to say they project from the plane of the mounting side 2, and a relief-like structure is formed on the mounting side.

Figure 2:
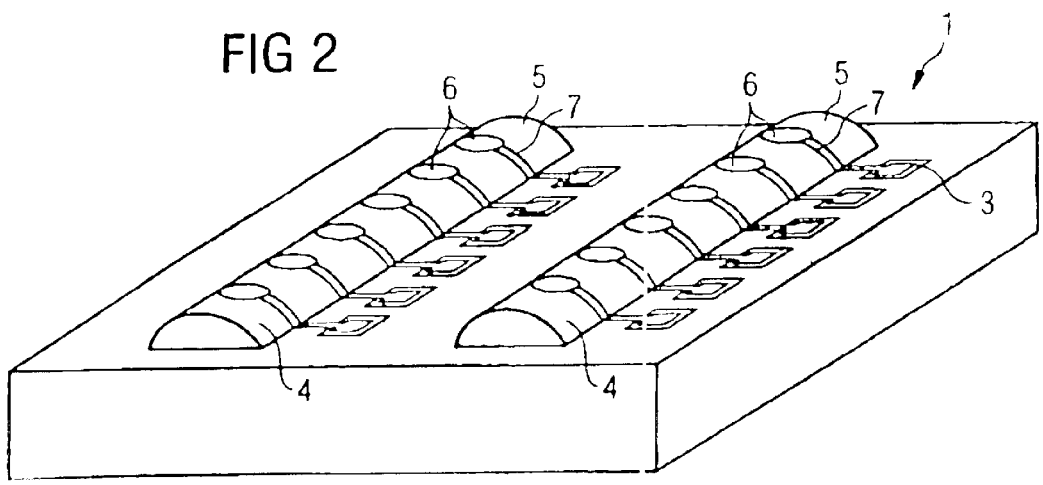

FIG. 2 shows the component 1 from FIG. 1. In a step which comes after the supports 4 have been put on, the contacts 6 are put onto the tops 5 of the supports 4. The contacts 6 are connected to the respectively associated bonding pads 3 by means of contact links 7. The contacts 6 and the contact links 7 can be put on or deposited in any way which is known to the person skilled in the art, e.g., by means of sputtering and plating. The contact and contact link material used can, by way of example, be copper, nickel or gold. As can be seen, a plurality of contacts have been put on a common support in the example shown. It is also conceivable to provide a separate support 4 for each contact. Since the support itself is made of dielectric material, the contacts 6 are adequately insulated from one another. The curved surface ensures that the contacts 6 can be positioned at the most protuberant point. Since the surface is curved, the contact link 7 can also be produced without any great difficulty, since there are no edges which are generally difficult to cover, etc.

Figure 3:
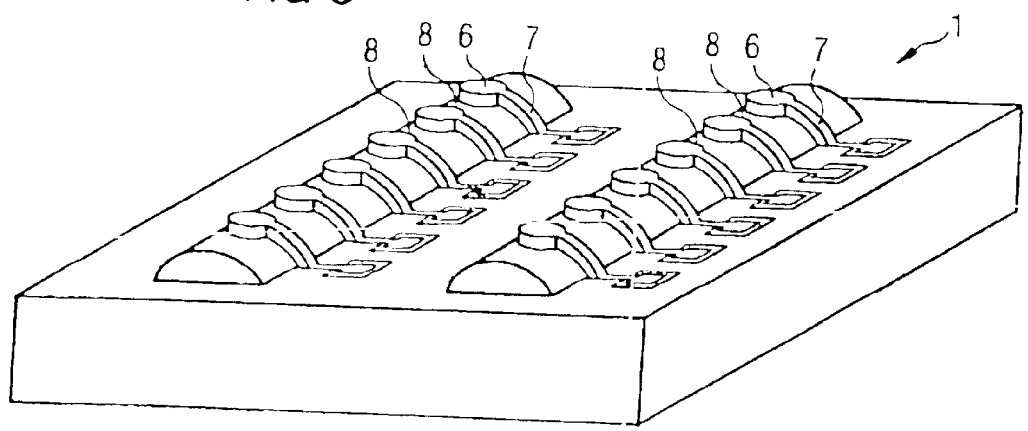
FIG. 3 is a diagram showing the component from FIG. 2 after the support has been eroded.

Next, as FIG. 3 shows, the area 8 between two contacts 6 is eroded, which is expediently done by means of selective etching. That is to say the support is removed in this area, and only the support material which is under the contact 6 and the contact link 7 remains, so that the hump-like structure shown in FIG. 3 is produced.

Figure 4:
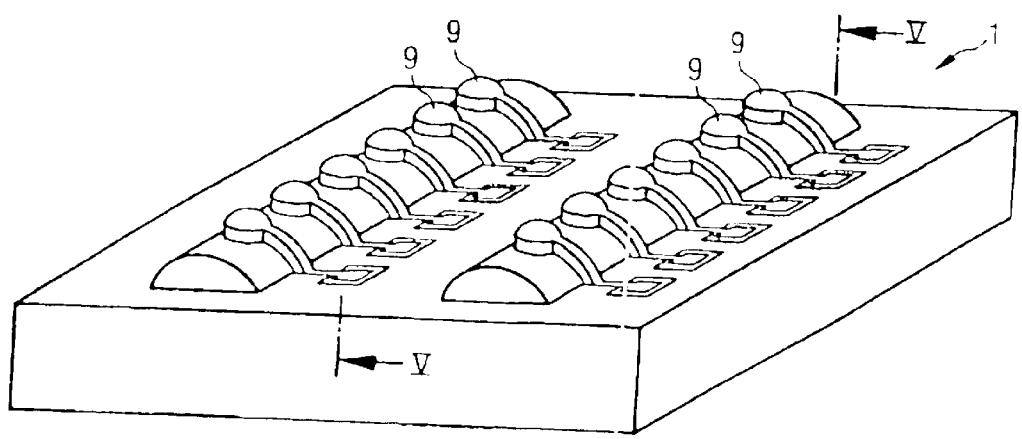
FIG. 4 is a diagram showing the component from FIG. 3 after a coating has been put onto the contacts.

Finally, as FIG. 4 shows, a coating 9 is put onto each contact 6, e.g., in the form of a thin conductive adhesive layer which can be applied by simple dipping. Alternatively, a thin solder layer, e.g., a tin coating, can also be put on which improves the metal/metal contact in the same way as the conductive adhesive layer.

Figure 5:
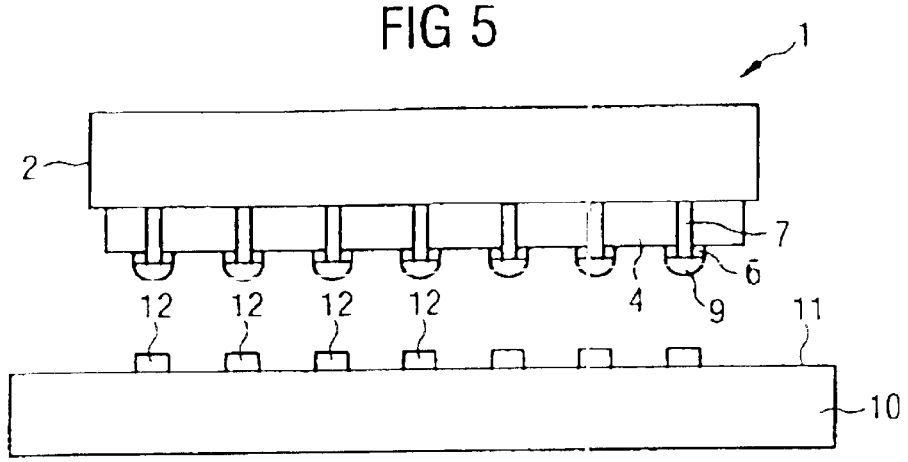
FIG. 5 is a side view showing the component from FIG. 4 ready for mounting, before mounting on a base.
Figure 6:
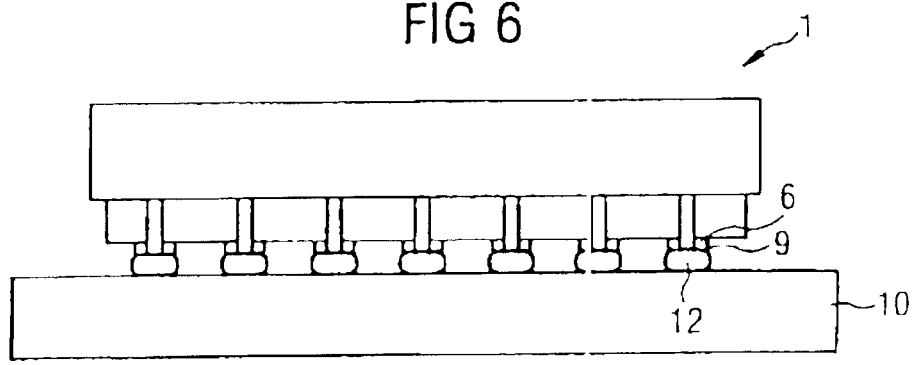
FIG. 6 is a side view showing the component from FIG. 5 after mounting on the base.

FIG. 5 now shows the ready-to-mount component 1, known from FIG. 4, before it is mounted on a base 10, e.g., a PC board. The mounting side 2 of the component 1 is positioned with respect to the top of the base 11, on which corresponding mating contacts 12 are provided, and is then seated on the base 10. If, by way of example, a conductive adhesive layer has been put on as the coating 9, then fixing is effected by means of the adhesive connection, and the respective contacts are also connected to one another electrically thereby. The elasticity of the support 4 means that any forces acting on the chip and/or the base are absorbed in compensatory fashion without any difficulty, whether they be horizontal or vertical forces.

It goes without saying that further steps used for the final fabrication of the component 1 can be fitted in between the individual steps shown in FIGS. 1–6. Thus, by way of example, the erosion of the support 4 (as shown in FIG. 3) can be followed by a wafer test, that is to say a test on the actual chip using burn-in via the relief-like contacts.

Other embodiments not described here are also within the scope of the following claims.

What is claimed is:

1. An electronic structure comprising: an electronic component configured for mounting onto the base; a raised elastic support positioned on the component, the support having a plurality of protruding pillars integral therewith; and a plurality of contacts, at least one of the plurality of contacts protruding from the support.

2. The structure of claim 1, wherein the component is a chip.

3. The structure of claim 1, further comprising a plurality of raised elastic supports positioned on the component.

4. The structure of claim 1, wherein the plurality of contacts is placed on a common support.

5. The structure of claim 1, wherein the support has a strip shape.

6. The structure of claim 1, wherein the support has an outwardly curved surface.

7. The structure of claim 1, wherein the support is a material selected from the group consisting of a dielectric material, silicone and a silicone-based material.

8. The structure of claim 1, further comprising:

a coating placed on each contact and capable of providing a firm connection to the base.

9. The structure of claim 1, further comprising a set of bond pads positioned on the component; and a contact link connecting the bond pad to a corresponding one of the plurality of contacts.

10. The structure of claim 1, wherein the base is mounted to the electric component, the base being in electric contact with the component.

11. A method for producing the electronic structure of claim 1, comprising:

placing the raised elastic support on the mounting side of the component;

placing at least one of the plurality of contacts onto the support; and eroding the support in an area between two of the plurality of contacts.

12. The structure of claim 3, wherein each of the plurality of contacts is put on a separate support.

13. The structure of claim 4, wherein the support is eroded in an area between two adjacent contacts.

14. The structure of claim 8, wherein the coating is a layer selected from the group consisting of a conductive adhesive layer, a solder layer and a layer with which contact can be made by pressure contact.

15. The structure of claim 10, wherein the base comprises a printed circuit board.

16. The method of claim 11, further comprising:

printing a support onto the component.

17. The method of claim 11, further comprising:

placing a plurality of supports onto the component; and placing at least one contact onto each support.

18. The method of claim 11, further comprising:

placing the plurality of contacts on the support.

19. The method of claim 11, wherein eroding the support comprises selectively etching the support.

20. The method of claim 11, further comprising selecting for the support a material from the group consisting of silicone, a dielectric and a silicone-based material.

21. The structure of claim 13, wherein the support is eroded by etching it away.

22. The method of claim 18, further comprising:

forming the component as a strip.

23. The method of claim 19, further comprising:

placing a coating onto the plurality of contacts, the coating capable of producing a firm connection to the base.

24. The method of claim 23, further comprising selecting for the layer from the group consisting of a conductive adhesive layer and a solder layer.

25. An electronic structure comprising, an electronic component configured to be in electric contact with a base and having a mounting side configured to for mounting onto the base;

a raised elastic support positioned on the component; and a plurality of contacts on the support, wherein the support is depressed around the contacts.

* * * * *